United States Patent [19]

Cuomo et al.

[11] Patent Number: 4,523,971
[45] Date of Patent: Jun. 18, 1985

[54] PROGRAMMABLE ION BEAM PATTERNING SYSTEM

[75] Inventors: Jerome J. Cuomo, Lincolndale; James M. E. Harper, Yorktown Heights, both of N.Y.; Harold R. Kaufman, Ft. Collins, Colo.; James L. Speidell, Carmel, N.Y.

[73] Assignee: International Business Machines Corporation, Armonk, N.Y.

[21] Appl. No.: 626,097

[22] Filed: Jun. 28, 1984

[51] Int. Cl.³ .................. B44C 1/22; C03C 15/00; C03C 25/06
[52] U.S. Cl. .................... 156/345; 118/728; 118/50.1; 118/620; 156/643; 156/646; 156/654; 204/192 E; 204/298
[58] Field of Search ............ 156/345, 643, 646, 654; 204/192 E, 192 EC, 298; 427/38, 39; 118/728, 50.1, 620; 134/1; 219/121 PD, 121 PE, 121 PR, 121 PU; 313/359.1, 360.1, 361.1, 362.1, 363.1; 315/111.31, 111.81, 111.91

[56] References Cited

U.S. PATENT DOCUMENTS 4,259,145  3/1981  Harper et al. ............... 156/345 X
4,411,733  10/1983  Macklin et al. .............. 156/643
4,450,031  5/1984  Ono et al. .................. 156/643 X Primary Examiner—William A. Powell
Attorney, Agent, or Firm—Jackson E. Stanland

[57] ABSTRACT

This ion beam system provides an ion beam pattern which is produced without the need for a mask. A programmable grid is used in combination with an ion beam source, where the apertures of the programmable grid can have electrical potentials associated therewith which either extract ions or impede the movement of ions through the apertures. Depending upon the electrical biasing provided to each of the apertures of the grid, different patterns of ions can be extracted through the grid. By changing the electrical bias at different locations on the programmable grid, these different patterns are produced. The patterns can be used for many applications, including patterned deposition, patterned etching, and patterned treatment of surfaces.

18 Claims, 4 Drawing Figures

PROGRAMMABLE ION BEAM PATTERNING SYSTEM

DESCRIPTION

1. Field of the Invention

This invention relates to an ion beam system for providing a pattern of ion beams, and more particularly to an ion beam system which can be used for etching, deposition, or surface treatment of substrates without the need for a mask, using an electrically "programmed" accelerator grid to pattern the ion beam.

2. Background Art

Ion beam sources are used for many applications, including deposition of materials onto substrates, etching of semiconducting and insulating materials, and surface treatment of materials (for purposes such as cleaning). These etching processes include ion milling and reactive ion beam etching. Each of these types of etching has different advantages, as is known in the art. Depending upon the type of etching required, the ions can be either reactive or nonreactive with the materials they strike.

In ion beam deposition, the ion beam strikes a target in order to release atoms therefrom, which then travel to substrates where the atoms nucleate. This type of operation often requires a focused ion beam of sufficient current energy in order to release target atoms at a practical rate.

Whether the ion beams are used for etching or for deposition, the ion beam source typically includes one or more grids to provide the ion beam. The use of these grids allows the production of ion beams of different energies, and different focussing, so that the ion beam can be tailored to the desired application. For example, U.S. Pat. No. 4,259,145 in the names of J. M. E. Harper et al, which is assigned to the present assignee, uses a single extraction grid having multiple apertures in order to obtain high current densities at low ion energies. That patent describes a disadvantage in the use of a pair of grids (i.e., a screen grid and an acceleration grid) wherein a shielding effect occurs that reduces the maximum ion current that can be extracted. In this patent, the plasma sheath between the plasma and the single grid 22, is used as a screen grid in order to extract a collimated beam of ions. Several advantages are described in this reference, including ease of manufacturing and low cost, the use of low energy ions in the beam to minimize physical sputtering, and the availability of a high current density of ions in the beam.

In all presently known ion beam systems, the pattern to be deposited or etched is produced through the use of one or more masks, which are in the form of photoresist or mechanical masks located in the vacuum chamber housing the ion beam source. Depending upon the type of mask that is used, different patterns of deposition or etching can be produced. If desired, a mask can also be used for surface treatment applications in order to surface-treat specific areas of a material, rather than surface-treating the entire area of the material.

While masks have been used effectively to provide patterned deposition, etching, or surface treatment, the need for masks is not without disadvantages. For example, if a series of patterns must be provided, multiple masks have to be used which means that vacuum must be broken a number of times. This is a disadvantage since contamination can occur. Also, it is time consuming. In addition to these problems, effects such as uneven etching (trenching) occur, as well as problems associated with the often difficult removal and replacement of masks.

Another problem associated with the requirement of masks for providing patterns is that processes such as in-line wafer processing become more difficult. In this type of processing, the wafer is brought below a series of masks so that multiple treatment steps can be undertaken. When masks have to be continually removed and replaced, in-line wafer processing is impeded.

Accordingly, it is a primary object of this invention to provide an improved ion beam system in which the need for masks is eliminated whether the ion beam system is used for deposition, etching or surface treatment.

It is another object of the present invention to provide an improved ion beam system suitable for any type of application wherein the need for masks to pattern an ion beam is eliminated by the use of a programmable acceleration grid which provides an ion beam pattern.

It is another object of the present invention to provide an ion beam system that will provide a patterned ion beam, where the ion beam pattern can be changed electrically.

It is another object of the present invention to provide an ion beam system using an electrically changeable accelerator grid for providing a pattern of ions which can strike a substrate for any purpose, the pattern of ions being changeable electrically.

It is another object of the present invention to provide an ion beam system which eliminates the problems generally associated with the use of masks to provide ion beam patterns.

It is a further object of the present invention to provide an improved ion beam system which can be used for multi-wafer processing and for personalization of patterns on wafers on a real-time basis.

It is a still further object of the present invention to provide an ion beam system which can be used to provide different patterns of ion beams, where the patterns can be rapidly changed without breaking vacuum.

It is another object of the present invention to provide an ion beam system capable of producing different patterns of ion beams with high resolution, said patterns being electrically programmable without the need for different masks.

It is another object of this invention to provide an ion beam system that can be used to produce different ion beam patterns, thereby eliminating the need for multiple masks to provide different patterns of ion beams.

It is a further object of the present invention to provide an ion beam system in which patterns of ion beams can be provided in a manner which is electrically programmable and which does not require a plurality of masks to provide the different patterns.

DISCLOSURE OF THE INVENTION

This ion beam system uses an electrically programmable, or changeable, grid for either extracting ions or preventing them from being extracted from the plasma within the ion source. Individual electrical control is provided around each aperture of the grid, or around groups of apertures, in order to control the locations of ions which pass through the apertures to the surface which the ions strike. Since individual apertures in the grid can be electrically controlled, the ion beam which is produced is itself patterned. This eliminates the need for masks to convert a broad-uniform ion beam to a pattern ion beam.

The ion beam system of this invention can use a screen grid for providing collimated ions to the programmable grid which produces the actual ion pattern. In another embodiment, the screen grid is eliminated and the programmable grid is itself used for extraction and acceleration of the ions which form the ion beam pattern.

Provision of a programmable, or controllable, grid can be adapted into any type of ion beam system, such as those described by H. R. Kaufman et al, J. Vac. Sci. Technol., 21 (3), page 725, September/October 1982. Further, the improved ion beam system of this invention can be used for any of the applications described by J. M. E. Harper et al, ibid, page 737. As an example, a multiple aperture ion source of the type described in aforementioned U.S. Pat. No. 4,259,145 can be equipped with an accelerator grid having individually addressed conducting elements around each extraction aperture of the accelerator grid. When a grid aperture is allowed to float electrically, ions will not pass through that aperture while, when the aperture is biased to a negative voltage, ions will be extracted through that aperture. Therefore, by controlling the entire pattern of voltages to be applied to the apertures of the grid, a particular pattern of ions will be extracted. This pattern can be electrically changed in accordance with the fabrication process being undertaken.

These and other objects, features, and advantages will be apparent from the following more particular description of the preferred embodiment.

BEST MODE FOR CARRYING OUT THE INVENTION

In the practice of this invention, a control grid of a particular type is used in any type of ion beam system in order to provide a patterned ion beam without the need for masks to provide a pattern. This grid will be termed a "programmable" acceleration grid, since it can be electrically changed at various locations of the grid to either extract ions from an ion plasma, or prevent the extraction of these ions from the ion plasma. Depending upon the electrical biasing of the various apertures in this programmable grid, any pattern of ions can be created.

Figure 1:
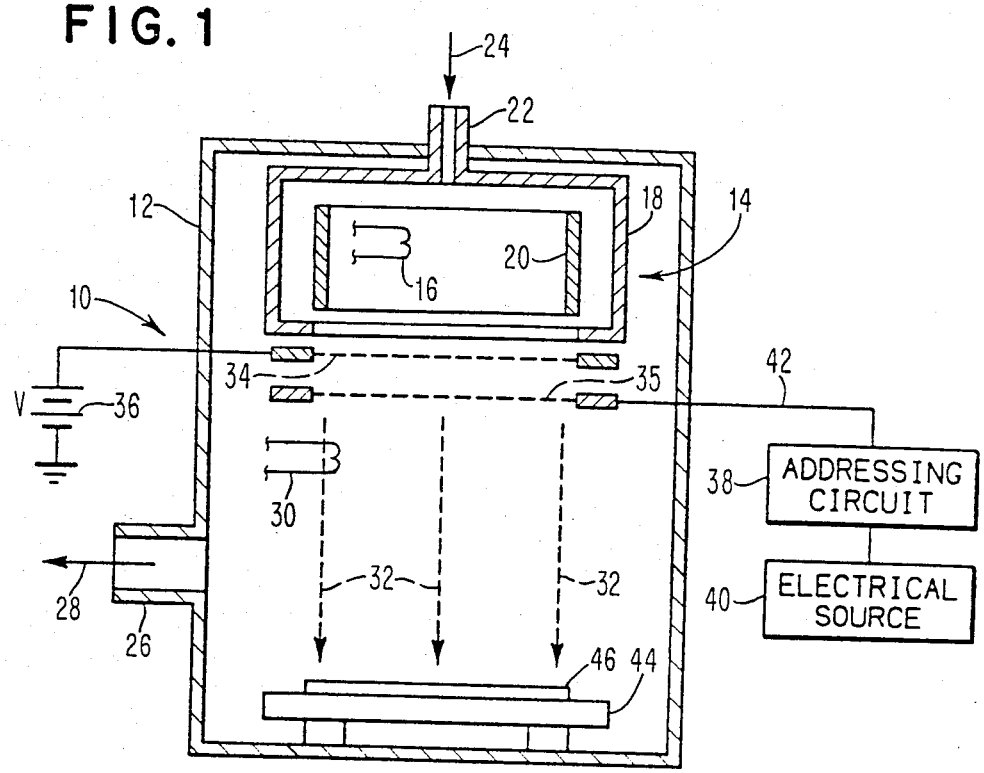
FIG. 1 is a schematic illustration of an ion beam system using the present invention, having a screen grid and a programmable acceleration grid to provide a patterned beam of ions.

FIG. 1 illustrates a multi-grid embodiment of the present invention. In this figure, an ion beam system, generally designated 10, is used for producing a patterned ion beam within chamber 12 which is, for instance, a conventional vacuum chamber. An ion source 14 is located within chamber 12, and includes a thermionic cathode 16 located within the walls 18 of the ion source 14. An anode, such as cylindrical anode 20, is also located within walls 18. While the anode 20 is shown as a cylindrical anode in FIG. 1, it can be the type of anode shown in aforementioned U.S. Pat. No. 4,259,145. Inlet port 22 is used to provide a gas into the ion source, as indicated by the arrow 24. As is well known in the art, the input gas is ionized in chamber walls 18 to provide an ion plasma.

Chamber 12 is provided with an outlet port 26 which can be used to remove volatile gasses, etc., from within chamber 12, as indicated by the arrow 28. Also located within chamber 12 is a neutralizer filament 30, which is used to provide electrons to compensate the positive charge of the ions in the patterned ion beam, represented by arrows 32. Such neutralizing electrons are particularly useful if the substrates subjected to the ion beams are insulating wafers. This type of neutralizing operation and the general structure of the total ion beam system 10 are well known in the art.

A screen grid 34 is used to extract ions from the ion plasma formed within chamber walls 18. This screen grid will also cause some acceleration of the ions and will provide collimation of the ions prior to their arrival at the programmable grid 35. Grid 34 is typically at a voltage V provided by the source 36. Programmable grid 35 is provided with voltages at each of its apertures, in accordance with signals provided to selected apertures via the addressing circuit 38, which is connected to the electrical source 40. In this figure, the various connections to the grid 35 are generally indicated by the conductor 42. In practice, the addressing circuit 38 can be any circuit well known in the art for providing signals to x-y conductors such as those typically used in memory circuits. If desired, a computer can provide the electrical signals on the various x-y conductors of the grid 35. The actual physical structure of grid 35 and the electrical connections adjacent to each of the apertures therein will be more apparent from FIGS. 2 and 3.

A holder 44 is located within chamber walls 12, and is used to hold the substrates 46 which are to be struck by the patterned ion beam 32. Rather than requiring a masking layer over substrates 46, the present invention provides a patterned ion beam which can be used to surface treat, etch, or deposit onto selected locations of substrate 46.

In operation, heating current is applied to the thermionic cathode 16 to create free electrons. A discharge voltage between cathode 16 and anode 20 is applied at about 50–100 volts. A gas, such as argon, $CF_4$, $N_2$, $O_2$, etc., is applied through input port 22. Electrons emitted from the cathode 16 are accelerated to anode 20 by the discharge voltage, and strike the gas atoms within chamber walls 18. This creates an ion plasma within walls 18. These positive ions are accelerated from the discharge chamber by a high voltage (typically 500–1000 V) applied between the anode 20 and ground. The ions are extracted by screen grid 34 and, depending upon the potentials applied to the individual apertures in grid 35, are either retained in the plasma or extracted from it to produce the patterned ion beam 32.

It will be understood by those of skill in the art that the particular structure of the ion source 15 and the electrical biases applied to the various components thereof can be changed from that shown in FIG. 1, in order to be able to provide the plasma a ions and electrons in chamber 18.

Screen grid 34 is a type of grid known in the art, such as that described in aforementioned U.S. Pat. No. 4,259,145. The material used to fabricate grid 34 is an electrically conducting material, such as a metal or graphite. Generally, pyrolytic graphite is preferred, since this material has a low erosion rate and will not be worn away readily by the ions which strike it. Other suitable materials are conducting refractory materials having high melting points which are able to withstand the high temperatures and high energies of the ion beam. Also, Si grids can be fabricated by microelectronic techniques.

The programmable acceleration grid 35 includes a plurality of current carrying conductors associated with each of the apertures therein. It is generally comprised of an insulating material having a conductive pattern thereon, as will be more clearly evident in FIGS. 2 and 3. The important feature is that conductor patterns are associated with individual apertures, or groups of apertures, and are electrically insulated from one another so that different potentials can be applied to different locations of the grid 35.

While FIG. 1 illustrates a dual-grid system, it should be understood that the screen grid 34 can be omitted, and its function provided by the programmable grid 35. In a typical example of a dual-grid system, the anode 20 has a bias of approximately 500 volts above ground, while the cathode 16 is approximately 50 volts negative with respect to the anode. The housing 18 is grounded and the screen grid 34 has a bias of approximately the cathode potential (i.e., 450 volts). The programmable grid 35 has different voltages at different apertures therein to either extract or prevent ions from leaving the plasma. In order to extract ions a negative voltage of approximately −100 volts is applied to selected apertures while, to prevent the extraction of ions, the apertures are allowed to electrically float to the ion potential of the plasma.

If the screen grid 34 is omitted and only the programmable grid 35 used, the electrical potentials applied to the ion beam system can be approximately the same as those described in the previous paragraph. However, a single-grid system is generally used for providing low energy beams. For this purpose, lower voltages will be used since a single-grid system provides more extracted ions at low voltage than does a dual-grid system.

Figure 2:
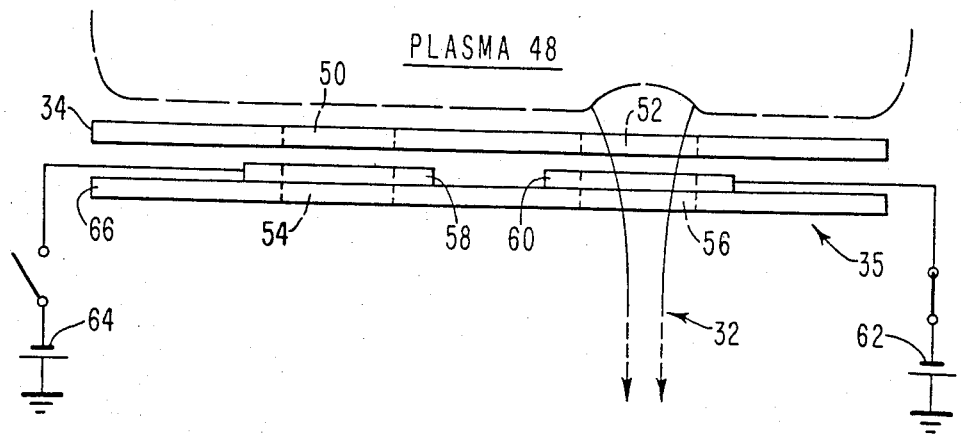
FIG. 2 is a schematic illustration of a portion of the structure shown in FIG. 1, and illustrates how selective biasing of the apertures in the programmable acceleration grid will produce a patterned ion beam.

FIG. 2 illustrates the operation of the programmable grid 35. The purpose of this grid is to selectively determine where ions are to be extracted from the plasma 48, or retained in the plasma, in order to produce the patterned ion beam 32. In this figure, the screen grid 34 includes apertures 50 and 52, while the programmable grid 35 includes aligned apertures 54 and 56. Surrounding aperture 54 is a conductor pattern 58, while conductor pattern 60 surrounds aperture 56. In the operation, it is desired to extract ions from plasma 48 through aperture 56, but to prevent ions from passing through aperture 54.

A negative bias of approximately −100 volts is applied to conductor pattern 60 via source 62, while conductor pattern 58 is unconnected to voltage source 64 in this figure. This means that conductor pattern 58 will float to the ion potential, and no ions will be extracted through aperture 54. On the other hand, an ion beam 32 will be extracted through aperture 56 due to the negative potential applied to conductor pattern 60.

In FIG. 2, programmable grid 35 is comprised of a layer 66 of an insulating material such as silicon or glass, onto which the conductor patterns 58 and 60 have been deposited by techniques such as sputtering and evaporation. These techniques are well known in the art and can be used to provide patterns of very high resolution. The aperture size in the grid 35 is limited by the resolution by the process used to define the apertures and the conducting patterns 58 and 60. Typically, aperture sizes of about 1 mm. to 5 mm. or less are used. In a dual-grid system, the size of the apertures is on the order of the spacing between the screen grid 34 and the programmable grid 35. If a screen grid is omitted in the ion system, the aperture size in the programmable grid can be a factor of 5–10 times smaller. Micron size apertures are within the range that can be provided by existing fabrication techniques.

In practice, the potentials applied to the conducting patterns 58 and 60 can be rapidly switched, in times such as microseconds, in order to change the pattern of ions extracted from the plasma. Since the patterns can be electrically programmed, the need for multiple masks to divide different ion beam patterns will be eliminated.

In a dual-grid system of the type shown in FIG. 1, the distance between the screen grid 34 and the programmable grid 35 is generally a few milimeters, as is customarily used between screen grids and accelerator grids in prior art ion beam systems. The distance between the programmable grid 35 and the substrate 46 on which the patterned ion beam is incident typically ranges from a few millimeters to tens of centimeters. This distance is determined by the divergence (angular spread) of the individual beamlets 32 exiting the grid 35. This spacing is generally chosen in accordance with the energy of the ions and the resolution which is required.

Figure 3:
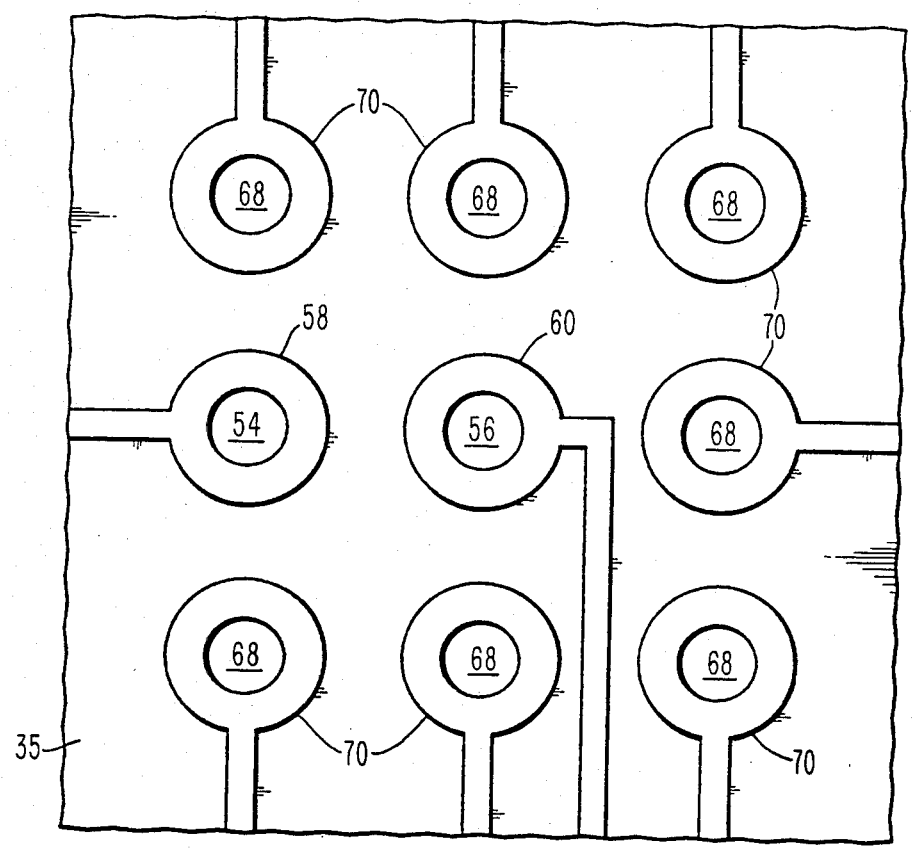
FIG. 3 is a top view of a portion of the programmable acceleration grid, illustrating the conducting patterns which are associated with each of the apertures in the grid, for selectively extracting or preventing the extraction of ions from the plasma, produce a patterned ion beam.

FIG. 3 is a top view of the programmable grid 35, illustrating the pattern of conductors around each of the apertures in the grid. For the purposes of relating FIG. 3 to the side view of FIG. 2, the apertures 54, 56 are indicated, as well as the associated conducting patterns 58 and 60. Other apertures 68 are also indicated, as are other conducting patterns 70. When a voltage is applied to any of the conducting patterns, those patterns will electrostatically carry a negative potential which will extract ions from the plasma. When no voltage is applied to the conducting patterns, the patterns will float to the ion potential and ions will not be extracted through the apertures. The voltages on any of the conducting patterns, such as 58 and 60, are applied to the associated electrical conductors using the addressing circuits 38 and electrical source 40 shown in FIG. 1. Conventional x-y addressing schemes can be used to select the patterns of ions extracted from grid 35.

Figure 4:
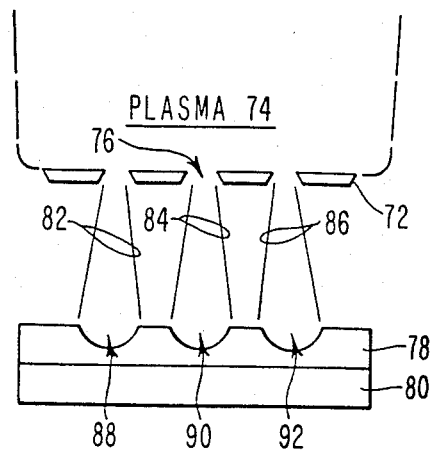
FIG. 4 schematically illustrates an experiment to establish that a patterned ion beam can be produced with tolerable beam divergence, illustrating that suitable resolution can be obtained using the programmable acceleration grid of the present invention.

FIG. 4 schematically illustrates an apparatus which was used to demonstrate the resolution of the ion beam patterns obtained from a programmable grid. In the apparatus of FIG. 4, a single grid 72 is used as an accelerating grid to extract ions from the plasma 74. Grid 72 was fabricated from a silicon wafer and was biased such that argon ions were obtained from plasma 74 at an energy of 200 eV. The diameter of the aperture 76 in grid 72 was about 0.005″. The target of the beam was a copper film 78 located on a silicon substrate 80. The distance between the grid 72 and the top surface of film 78 was 5 mm.

In this demonstration, all of the apertures 76 of the grid 72 was biased to extract ions from the plasma 74. This produced individual beamlets 82, 84 and 86. Individual beamlets 82–86 produce etched areas 88, 90, and 92 respectfully. The size of these etched areas indicate an ion beamlet diversion angle of 0.9 degrees.

In a separate demonstration, the grid 72 was allowed to electrically float to the ion potential (i.e. no voltage was applied to the conducting pattern adjacent to grid aperture 76) which prevented the extraction of ions from plasma 74. Thus, a programmable grid of the type described herein can be used to make depositions or etched patterns in a substrate with good resolution, and without the need for multiple masks. The potentials applied to the conducting portions of the programmable grid can be changed rapidly (in microseconds) to rapidly change the pattern of the ion beams impinging upon the substrate.

In the practice of this invention, substrates can be continually moved passed an ion beam system including this programmable grid, in order to personalize different substrates with different patterns. As an example, a single line of apertures may be used in the programmable grid, with a plurality of substrates being moved past the grid in order to change the ion beam pattern, depending upon the nature of the substrate in the particular step in the fabrication process.

In the further practice of this invention, it will be apparent to those skilled in the art that any type of ion or charged particle can be used to provide a patterned beam of these charged particles. The principles of this invention can be applied to either positive or negatively charged ions, atoms, molecules, particles, etc. However, the greatest utility for the present invention will be in ion beam systems utilizing positively charged ions for various processing steps in the fabrication of microelectronic structures and other thin film structures.

Although the invention has been described with respect to particular embodiments thereof, it will be apparent to those skilled in the art that variations can be made therein without departing from the scope and concept of the present invention.

What is claimed is:

1. An ion beam system for producing a patterned ion beam without the need for masks, comprising:
   an ion source for producing ions,
   a programmable grid having a plurality of extraction apertures therein through which said ions can selectively be extracted from said ion source to produce said patterned beam,
   electrical bias means for electrically biasing individual ones of said extraction apertures for selectively extracting ions from said ion source or preventing the extraction of said ions, thereby producing said ion beam pattern,
   means for selectively changing the electrical bias on individual ones of said extraction apertures in order to change said selected ion beam pattern.

2. The system of claim 1, where said ions are positively charged.

3. The system of claim 2, where said ions are negatively charged.

4. The system of claim 1, further including a screen grid located between said ion source and said programmable grid, said screen grid being biased to extract said ions through said screen grid to provide collimated ions to said programmable grid.

5. The system of claim 1, where said programmable grid is an insulating layer having said apertures therein, and said electrical bias means including a patterned conductive layer located on said insulating layer, said conductive layer producing an electrical potential at those apertures where it is desired to extract ions through said programmable grid.

6. The system of claim 1, further including a substrate onto which said patterned ion beam is incident.

7. The system of claim 1, where said electrical bias means includes a voltage source and addressing means for producing an electrical bias at selected extraction apertures of said programmable grid.

8. The system of claim 1, where said ion source includes means for producing a plasma of said ions,
   said programmable grid being electrically biased at particular locations therein to extract ions from said plasma at said locations.

9. An ion beam system for producing a patterned ion beam without the need for masks, said system including:
   means for creating a plasma of ions in a vacuum chamber,
   a programmable grid located adjacent to said plasma of ions for extracting ions from said plasma at selected locations of said grid, said grid including a plurality of apertures through which an extracted ions pass into said vacuum chamber, and
   means for controlling the extraction of ions through selected apertures in said grid, said means for controlling including means for extracting ions through selected ones of said apertures and for preventing the extraction of ions from said plasma through other selected apertures of said grid.

10. The system of claim 9, further including means for selectively addressing selected apertures in said grid for the passage of ions therethrough, and for changing the location of said selected apertures in order to produce different patterns of said ion beam.

11. The system of claim 10, where said means for extracting ions through selected apertures of said grid includes electrical bias means for producing bias voltages at those apertures of said grid through which said ions are to pass from said plasma into said vaccum chamber.

12. The system of claim 11, where said electrical bias means includes a pattern of electrical conductors located adjacent to the apertures in said grid, said conductors being individually addressed to produce an electrical potential at selected individual ones of said conductors.

13. The system of claim 12, where said ions are positively charged.

14. The system of claim 12, where said ions are negatively charged.

15. The system of claim 12, further including a substrate located within said vacuum chamber, on which said patterned ion beam is incident.

16. An ion beam system for providing patterned ion beams without the use of masks, comprising in combination:
   an ion source,
   a programmable grid adjacent to said source, said grid having a plurality of apertures therein through which said ions can selectively pass under control of an electrical control means, electrical control means for controlling which of said apertures said ions will pass through, to produce a patterned ion beam, and addressing means connected to said electrical control means for changing the locations of the apertures through which said ions will pass to produce a different pattern of ions.

17. The system of claim 16, where said electrical control means includes electrical conductor means adjacent to each of said apertures for applying different electrical potentials to selected ones of said apertures, and a voltage source for producing said electrical potential.

18. In an ion beam system including a vacuum chamber, an ion source for producing a plasma of ions, and a grid adjacent to said plasma having a plurality of apertures therein through which said ions can be extracted from said plasma, the improvement wherein said system includes electrical means for extracting ions through a selected pattern of said apertures while preventing the extraction of ions through others of said apertures and addressing means for changing the pattern of apertures through which said ions are extracted.

* * * * *